United States Patent
Camacho et al.

(10) Patent No.: US 8,304,869 B2
(45) Date of Patent: Nov. 6, 2012

(54) FAN-IN INTERPOSER ON LEAD FRAME FOR AN INTEGRATED CIRCUIT PACKAGE ON PACKAGE SYSTEM

(75) Inventors: Zigmund Ramirez Camacho, Singapore (SG); Jairus Legaspi Pisigan, Singapore (SG); Lionel Chien Hui Tay, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 561 days.

(21) Appl. No.: 12/185,061

(22) Filed: Aug. 1, 2008

(65) Prior Publication Data

US 2010/0025834 A1 Feb. 4, 2010

(51) Int. Cl.
*H01L 23/495* (2006.01)
*H01L 21/44* (2006.01)

(52) U.S. Cl. ............... 257/676; 257/778; 257/E23.039; 257/E23.169; 438/108; 438/112; 438/123; 438/124

(58) Field of Classification Search .......... 257/676, 257/777, 778, E23.039, E23.052, E23.123, 257/E23.128, E23.129, E23.169; 438/108, 438/110–112, 123, 124

See application file for complete search history.

(56) References Cited

U.S. PATENT DOCUMENTS

| | | | |
|---|---|---|---|
| 5,444,296 A | 8/1995 | Kaul et al. | |
| 5,579,207 A | 11/1996 | Hayden et al. | |
| 5,748,452 A | 5/1998 | Londa | |
| 5,854,507 A | 12/1998 | Miremadi et al. | |
| 5,963,430 A | 10/1999 | Londa | |
| 5,982,633 A | 11/1999 | Jeansonne | |
| 6,101,100 A | 8/2000 | Londa | |
| 6,242,932 B1 | 6/2001 | Hembree | |
| 6,529,027 B1 | 3/2003 | Akram et al. | |
| 6,555,898 B2 | 4/2003 | Wensel | |
| 6,559,526 B2 | 5/2003 | Lee et al. | |
| 6,603,072 B1 * | 8/2003 | Foster et al. | 174/536 |
| 6,696,748 B1 | 2/2004 | Thurgood | |
| 6,855,574 B2 | 2/2005 | Thurgood | |
| 6,861,288 B2 | 3/2005 | Shim et al. | |
| 6,992,396 B2 | 1/2006 | Arai et al. | |
| 7,023,076 B2 | 4/2006 | Khiang | |
| 7,093,358 B2 | 8/2006 | Akram et al. | |
| 7,109,574 B2 | 9/2006 | Chiu et al. | |
| 7,169,645 B2 | 1/2007 | Bolken et al. | |
| 7,187,067 B2 | 3/2007 | Weng et al. | |
| 7,193,298 B2 | 3/2007 | Hong et al. | |
| 7,202,554 B1 | 4/2007 | Kim et al. | |
| 7,247,519 B2 | 7/2007 | Karnezos et al. | |
| 7,288,835 B2 | 10/2007 | Yim et al. | |
| 7,309,913 B2 * | 12/2007 | Shim et al. | 257/686 |
| 7,354,800 B2 | 4/2008 | Carson | |
| 7,364,945 B2 | 4/2008 | Shim et al. | |
| 7,365,427 B2 | 4/2008 | Lu et al. | |
| 7,501,697 B2 | 3/2009 | Yim et al. | |
| 7,687,315 B2 * | 3/2010 | Carson | 438/109 |

(Continued)

*Primary Examiner* — Matthew E Warren
(74) *Attorney, Agent, or Firm* — Ishimaru & Associates LLP; Mikio Ishimaru; Stanley M. Chang

(57) ABSTRACT

An integrated circuit package on package system includes: providing a lead having a wire-bonded die with a bond wire connected thereto; mounting a fan-in interposer over the wire-bonded die and the bond wire; connecting the fan-in interposer to the lead with the bond wires; and encapsulating the wire-bonded die, bond wires, and the fan-in interposer with an encapsulation leaving a portion of the fan-in interposer exposed.

20 Claims, 7 Drawing Sheets

U.S. PATENT DOCUMENTS

| | | |
|---|---|---|
| 2002/0030261 A1 | 3/2002 | Rolda, Jr. et al. |
| 2003/0038354 A1 | 2/2003 | Derderian |
| 2004/0229401 A1 | 11/2004 | Bolken et al. |
| 2005/0090050 A1 | 4/2005 | Shim et al. |
| 2005/0148113 A1 | 7/2005 | Karnezos |
| 2005/0255628 A1 | 11/2005 | Kinsman |
| 2006/0076665 A1 | 4/2006 | Kim et al. |
| 2006/0097402 A1 | 5/2006 | Pu et al. |
| 2006/0240595 A1 | 10/2006 | Lee et al. |
| 2006/0244157 A1* | 11/2006 | Carson .......................... 257/787 |
| 2006/0249828 A1 | 11/2006 | Hong |
| 2006/0275952 A1 | 12/2006 | Gowda et al. |
| 2007/0069371 A1 | 3/2007 | Iksan et al. |
| 2007/0085186 A1 | 4/2007 | Shen |
| 2007/0126097 A1 | 6/2007 | Lin |
| 2007/0145548 A1 | 6/2007 | Park et al. |
| 2007/0181990 A1 | 8/2007 | Huang et al. |
| 2007/0187826 A1* | 8/2007 | Shim et al. .................... 257/738 |
| 2007/0218689 A1 | 9/2007 | Ha et al. |
| 2007/0252284 A1 | 11/2007 | Su et al. |
| 2008/0006947 A1 | 1/2008 | Akiba et al. |
| 2008/0036051 A1 | 2/2008 | Espiritu et al. |
| 2009/0051023 A1 | 2/2009 | Nam et al. |
| 2009/0152700 A1 | 6/2009 | Kuan et al. |
| 2009/0152706 A1 | 6/2009 | Kuan et al. |
| 2009/0166835 A1* | 7/2009 | Yang et al. .................... 257/686 |
| 2009/0212442 A1 | 8/2009 | Chow et al. |
| 2009/0243064 A1* | 10/2009 | Camacho et al. ............. 257/680 |
| 2009/0309207 A1* | 12/2009 | Chow et al. ................... 257/686 |
| 2011/0006411 A1* | 1/2011 | Loo et al. ...................... 257/676 |

* cited by examiner

FAN-IN INTERPOSER ON LEAD FRAME FOR AN INTEGRATED CIRCUIT PACKAGE ON PACKAGE SYSTEM

CROSS-REFERENCE TO RELATED APPLICATION(S)

The present application contains subject matter related to co-pending U.S. patent application Ser. No. 11/954,601. The related application is assigned to STATS ChipPAC Ltd.

The present application also contains subject matter related to U.S. patent application Ser. No. 11/954,607, now U.S. Pat. No. 7,985,628. The related application is assigned to STATS ChipPAC Ltd.

The present application also contains subject matter related to co-pending U.S. patent application Ser. No. 12/035,493. The related application is assigned to STATS ChipPAC Ltd.

TECHNICAL FIELD

The present invention relates generally to integrated circuits and more particularly to a system for utilizing a fan-in interposer on a lead frame in a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package on package system including: providing a lead having a wire-bonded die with a bond wire connected thereto; mounting a fan-in interposer over the wire-bonded die and the bond wire; connecting the fan-in interposer to the lead with the bond wires; and encapsulating the wire-bonded die, bond wires, and the fan-in interposer with an encapsulation leaving a portion of the fan-in interposer exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
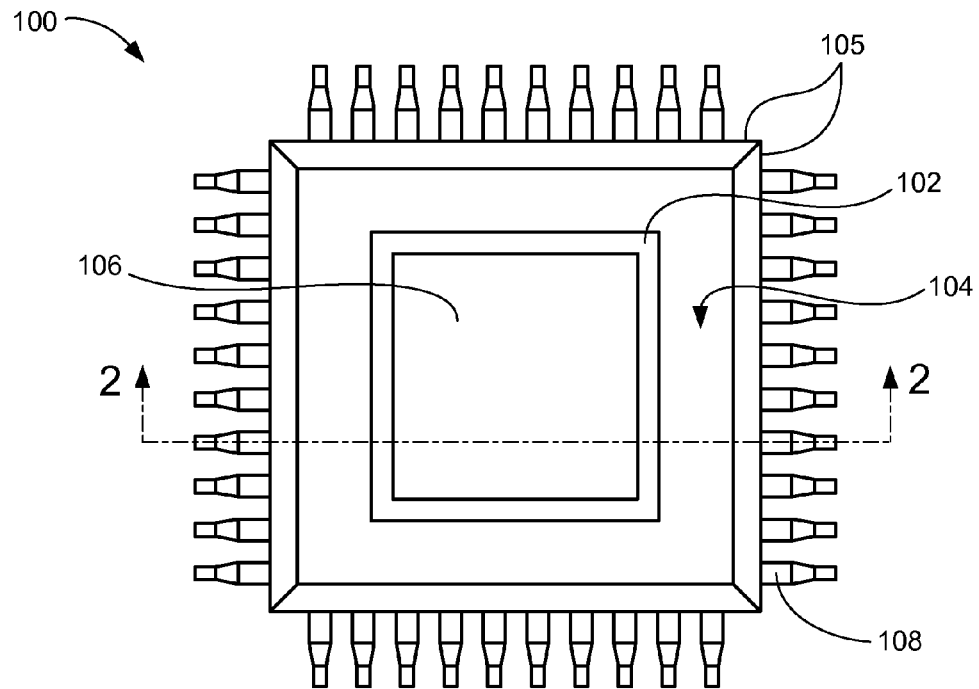
FIG. 1 is a top view of an integrated circuit package on package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the fan-in interposer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used. The term "fan-in" is used to describe inputs and outputs from an integrated circuit package system, which are directed through an interposer.

Referring now to FIG. 1, therein is shown a top view of an integrated circuit package on package system 100 in a first embodiment of the present invention. The integrated circuit package on package system 100 is shown having a fan-in interposer 102 such as a laminated plastic or ceramic fan-in interposer.

It has been discovered that the use of the fan-in interposer 102 allows a higher density of input signals to be sent directly through the fan-in interposer 102 and into the integrated circuit package on package system 100.

Partially encapsulating the fan-in interposer 102 is an encapsulation 104 such as a film assisted molding with outer edges 105. Mounted above the fan-in interposer 102 is an external device 106 such as a wafer level chip scale package (WLCSP), a redistributed line (RDL) die, or an area array package. Along the outer edges 105 of the encapsulation 104 leads 108 are mounted.

Figure 2:
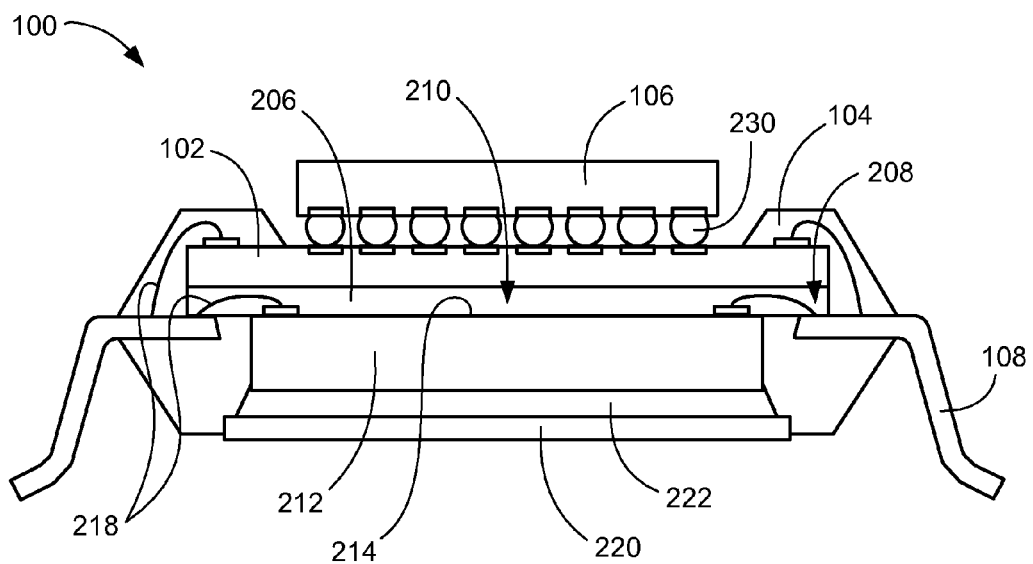
FIG. 2 is a cross-sectional view of the integrated circuit package on package system along the line 2-2 of FIG. 1.

Referring now to FIG. 2, therein is shown a cross-sectional view of the integrated circuit package on package system 100 along the line 2-2 of FIG. 1. The integrated circuit package on package system 100 is shown with the fan-in interposer 102 exposed from the encapsulation 104.

Mounted bellow the fan-in interposer 102 is a wire-in-film adhesive 206 with edges 208 and a center 210. The wire-in-film adhesive 206 is in direct contact with the fan-in interposer 102 and the leads 108. Mounted bellow and near the center 210 of the wire-in-film adhesive 206 is a wire-bonded die 212 with an active side 214.

The active side 214 of the wire-bonded die 212 is attached to the wire-in-film adhesive 206. Further, mounted bellow and near the edges 208 of the wire-in-film adhesive are the leads 108. The leads 108 are bent away from the fan-in interposer 102.

The leads 108 are first bent away from the fan-in interposer 102 and then bent out away from the edges 208 of the wire-in-film adhesive 206. The active side 214 of the wire-bonded die 212 is connected to the leads 108 with bond wires 218 therebetween. The wire-bonded die 212 can be within a horizontal plane of inner portions of the leads 108.

It has been discovered that exposing the fan-in interposer 102 from the encapsulation 104 allows for a higher density of input signals to be channeled into the integrated circuit package on package system 100. Further, the close proximity of the fan-in interposer 102 to the leads 108 reduces parasitic inductance from long connections which can occur with high frequency data transmission.

Still further, it has been discovered that attaching the fan-in interposer 102 to the leads 108 provides a simple process of manufacture. This reduces production time, and complexity lending to an overall yield increase.

Finally, utilizing both the fan-in interposer 102 and the leads 108 provides a simple solution enabling the external device 106 to be mounted above the fan-in interposer 102. This further increases component density allowing for smaller overall component footprint.

The wire-in-film adhesive 206 has a low viscosity and, as temperature increases, the viscosity gets lower. Therefore, the wire-in-film adhesive 206 can be easily pressed over the bond wires 218 and above and around the wire-bonded die 212 and then cured to harden the wire-in-film adhesive 206.

It has been discovered that the wire-in-film adhesive 206 should be a thermally conductive dielectric material. The wire-in-film adhesive 206 can be made of a B-stage material that can be hardened after curing and can maintain a predetermined thickness. Below the wire-bonded die 212 is a die pad 220.

The die pad 220 is attached to the wire-bonded die 212 with a die attach adhesive 222. From above, the fan-in interposer 102 is connected to the leads 108 with the bond wires 218.

The external device 106 is connected to the fan-in interposer 102 with interconnects such as solder balls 230. The encapsulation 104 fully encapsulates the wire-in-film adhesive 206, the bond wires 218, and the wire-bonded die 212.

The encapsulation 104 also encapsulates the fan-in interposer 102 near the bond wires 218. The fan-in interposer 102 is exposed from the encapsulation 104 allowing the external device 106 to be mounted. The die pad 220 is also exposed from the encapsulation 104 and extends below the encapsulation 104.

Figure 3:
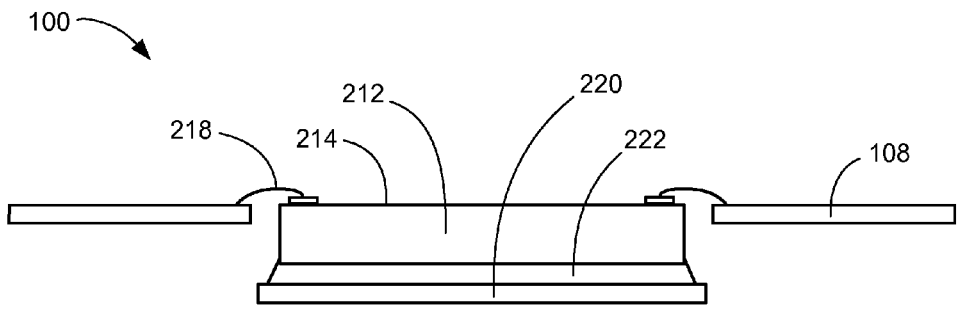
FIG. 3 is the integrated circuit package on package system of FIG. 2 in a die attach phase of manufacture.

Referring now to FIG. 3, therein is shown the integrated circuit package on package system 100 of FIG. 2 in a die attach phase of manufacture. The integrated circuit package on package system 100 is shown with the wire-bonded die 212 attached to the die pad 220 with the die attach adhesive 222. Further, the active side 214 of the wire-bonded die 212 is connected to the leads 108 with the bond wires 218.

Figure 4:
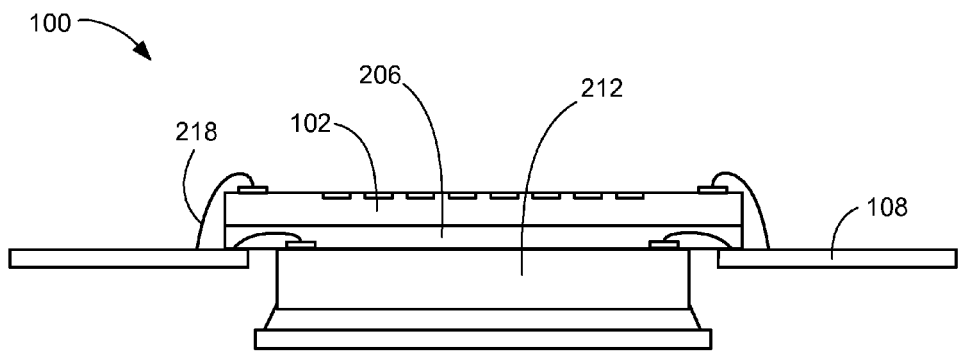
FIG. 4 is the integrated circuit package on package system of FIG. 2 in a fan-in interposer attach phase of manufacture.

Referring now to FIG. 4, therein is shown the integrated circuit package on package system 100 of FIG. 2 in a fan-in interposer attach phase of manufacture. The integrated circuit package on package system 100 is shown with the fan-in interposer 102 mounted above the wire-bonded die 212 and the wire-in-film adhesive 206 in between. Further, the fan-in interposer 102 is shown connected to the leads 108 with the bond wires 218.

Figure 5:
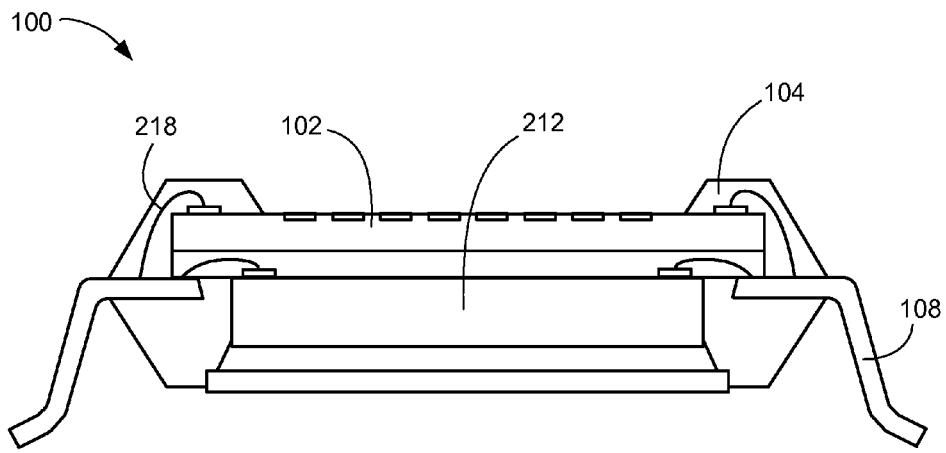
FIG. 5 is the integrated circuit package on package system of FIG. 2 in an encapsulation phase of manufacture.

Referring now to FIG. 5, therein is shown the integrated circuit package on package system 100 of FIG. 2 in an encapsulation phase of manufacture. The integrated circuit package on package system 100 is shown with the encapsulation 104 encapsulating the wire-bonded die 212, and the bond wires 218. The leads 108 are shown bent away from the fan-in interposer 102.

Figure 6:
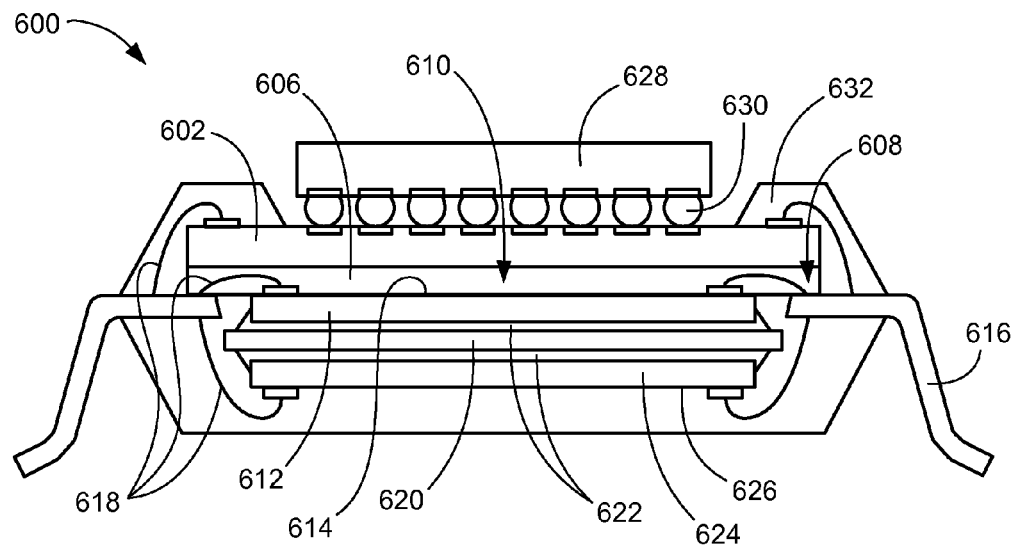
FIG. 6 is a cross-sectional view of an integrated circuit package on package system in a second embodiment of the present invention.

Referring now to FIG. 6, therein is shown a cross-sectional view of an integrated circuit package on package system 600 in a second embodiment of the present invention. The integrated circuit package on package system 600 is shown having a fan-in interposer 602.

The fan-in interposer 602 may be a laminated plastic or ceramic fan-in interposer. Mounted below the fan-in interposer 602 is a wire-in-film adhesive 606 with edges 608 and a center 610. Mounted below and near the center 610 of the wire-in-film adhesive 606 is a first wire-bonded die 612 with an active side 614.

The active side 614 of the first wire-bonded die 612 is attached to the wire-in-film adhesive 606. Further, mounted below and near the edges 608 of the wire-in-film adhesive are leads 616. The leads 616 are bent away from the fan-in interposer 602.

The leads 616 are first bent away from the fan-in interposer 602 and then bent out away from the edges 608 of the wire-in-film adhesive 606. The active side 614 of the first wire-bonded die 612 is connected to the leads 616 with bond wires 618.

The wire-in-film adhesive 606 has a low viscosity and, as temperature increases, the viscosity gets lower. Therefore, the wire-in-film adhesive 606 can be easily pressed over the bond wires 618 and above and around the first wire-bonded die 612 and then cured to harden the wire-in-film adhesive 606.

It has been discovered that the wire-in-film adhesive 606 should be a thermally conductive dielectric material. The wire-in-film adhesive 606 can be made of a B-stage material that can be hardened after curing and can maintain a predetermined thickness.

Below the first wire-bonded die 612 is a die pad 620. The die pad 620 is attached to the first wire-bonded die 612 with a die attach adhesive 622. Mounted below the die pad 620 is a second wire-bonded die 624 with an active side 626.

The active side 626 of the second wire-bonded die 624 faces away from the die pad 620. The second wire-bonded die 624 is attached to the die pad 620 with the die attach adhesive 622. The active side 626 of the second wire-bonded die 624 is connected to the leads 616 with the bond wires 618.

From above, the fan-in interposer 602 is connected to the leads 616 with the bond wires 618. Mounted above the fan-in interposer 602 is an external device 628 such as a wafer level chip scale package (WLCSP), a redistributed line (RDL) die, or an area array package.

The external device 628 is connected to the fan-in interposer 602 with interconnects such as solder balls 630. An encapsulation 632 fully encapsulates the wire-in-film adhesive 606, the bond wires 618, the first wire-bonded die 612, the second wire-bonded die 624, and the die pad 620.

The encapsulation 632 also encapsulates the fan-in interposer 602 near the bond wires 618. The fan-in interposer 602 is exposed from the encapsulation 632 allowing the external device 628 to be mounted.

Figure 7:
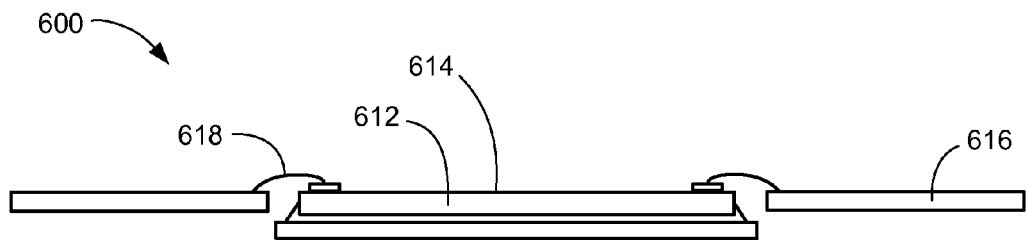
FIG. 7 is the integrated circuit package on package system of FIG. 6 in a die attach phase of manufacture.

Referring now to FIG. 7, therein is shown the integrated circuit package on package system 600 of FIG. 6 in a die attach phase of manufacture. The integrated circuit package on package system 600 is shown with the first wire-bonded die 612 attached to the die pad 620 with the die attach adhesive 622. Further, the active side 614 of the first wire-bonded die 612 is connected to the leads 616 with the bond wires 618.

Figure 8:
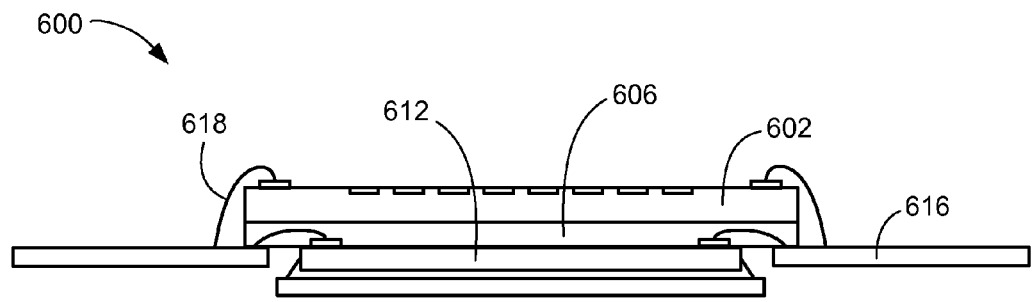
FIG. 8 is the integrated circuit package on package system of FIG. 6 in a fan-in interposer attach phase of manufacture.

Referring now to FIG. 8, therein is shown the integrated circuit package on package system 600 of FIG. 6 in a fan-in interposer attach phase of manufacture. The integrated circuit package on package system 600 is shown with the fan-in interposer 602 mounted above the first wire-bonded die 612 and the wire-in-film adhesive 606 in between. Further, the fan-in interposer 602 is shown connected to the leads 616 with the bond wires 618.

Figure 9:
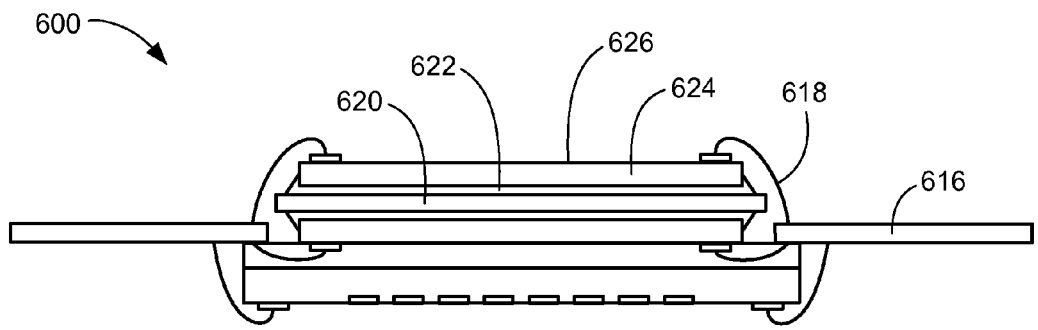
FIG. 9 is the integrated circuit package on package system of FIG. 6 in a second die attach phase of manufacture.

Referring now to FIG. 9, therein is shown the integrated circuit package on package system 600 of FIG. 6 in a second die attach phase of manufacture. The integrated circuit package on package system 600 is shown with the second wire-bonded die 624 mounted above the die pad 620. The active side 626 of the second wire-bonded die 624 is shown facing away from the die pad 620.

The second wire-bonded die 624 is attached to the die pad 620 with the die attach adhesive 622. The active side 626 of the second wire-bonded die 624 is connected to the leads 616 with the bond wires 618.

Figure 10:
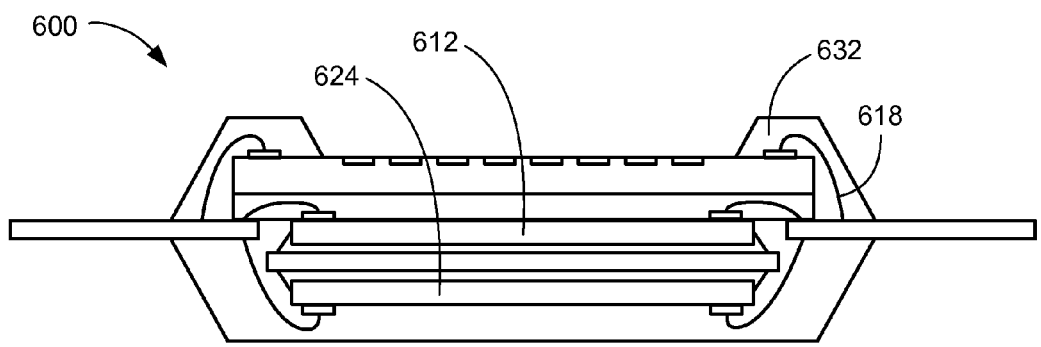
FIG. 10 is the integrated circuit package on package system of FIG. 6 in an encapsulation phase of manufacture.

Referring now to FIG. 10, therein is shown the integrated circuit package on package system 600 of FIG. 6 in an encapsulation phase of manufacture. The integrated circuit package on package system 600 is shown with the encapsulation 632 encapsulating the first wire-bonded die 612, the second wire-bonded die 624, and the bond wires 618.

Figure 11:
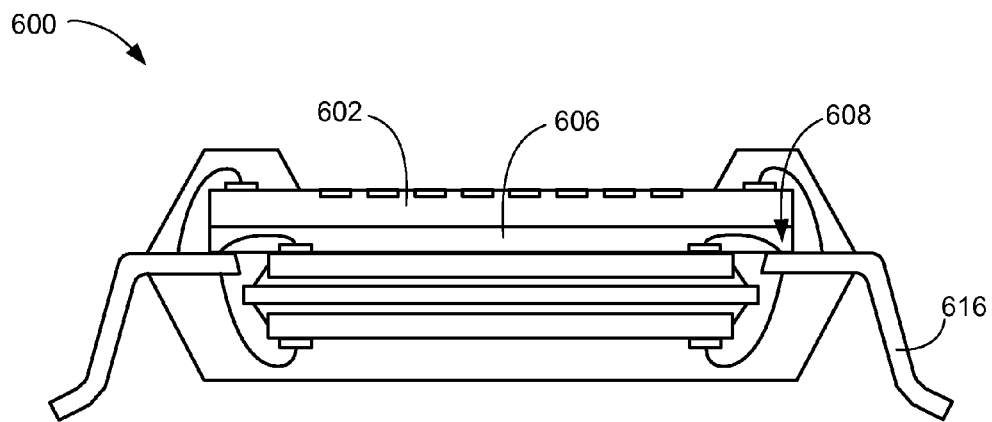
FIG. 11 is the integrated circuit package on package system of FIG. 6 in a lead-forming phase of manufacture.

Referring now to FIG. 11, therein is shown the integrated circuit package on package system 600 of FIG. 6 in a lead-forming phase of manufacture. The integrated circuit package on package system 600 is shown with the leads 616 bent away from the fan-in interposer 602 then out away from the edges 608 of the wire-in-film adhesive 606.

Figure 12:
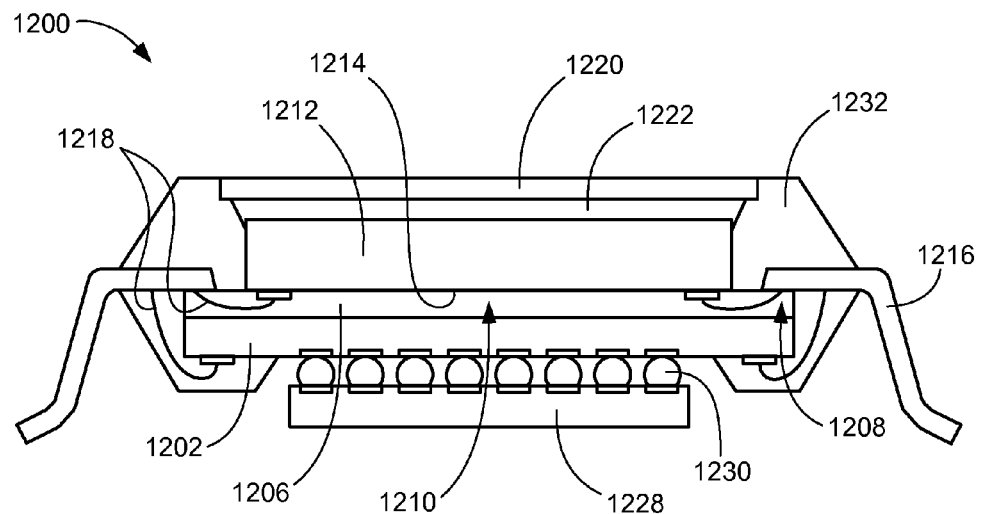
FIG. 12 is a cross-sectional view of an integrated circuit package on package system in a third embodiment of the present invention.

Referring now to FIG. 12, therein is shown a cross-sectional view of an integrated circuit package on package system 1200 in a third embodiment of the present invention. The integrated circuit package on package system 1200 is shown inverted having a fan-in interposer 1202.

The fan-in interposer 1202 may be a laminated plastic or ceramic fan-in interposer. Mounted above the fan-in interposer 1202 is a wire-in-film adhesive 1206 with edges 1208 and a center 1210. Mounted above and near the center 1210 of the wire-in-film adhesive 1206 is a wire-bonded die 1212 with an active side 1214.

The active side 1214 of the wire-bonded die 1212 is attached to the wire-in-film adhesive 1206. Further, mounted above and near the edges 1208 of the wire-in-film adhesive are leads 1108. The leads 1108 are bent toward the fan-in interposer 1202.

The leads 1108 are first bent toward the fan-in interposer 1202 and then bent out away from the edges 1208 of the wire-in-film adhesive 1206. The active side 1214 of the wire-bonded die 1212 is connected to the leads 1108 with bond wires 1218.

The wire-in-film adhesive 1206 has a low viscosity and, as temperature increases, the viscosity gets lower. Therefore, the wire-in-film adhesive 1206 can be easily pressed over the bond wires 1218 and above and around the wire-bonded die 1212 and then cured to harden the wire-in-film adhesive 1206.

It has been discovered that the wire-in-film adhesive 1206 should be a thermally conductive dielectric material. The wire-in-film adhesive 1206 can be made of a B-stage material that can be hardened after curing and can maintain a predetermined thickness. Below the wire-bonded die 1212 is a die pad 1220. The die pad 1220 is attached to the wire-bonded die 1212 with a die attach adhesive 1222.

From below, the fan-in interposer 1202 is connected to the leads 1108 with the bond wires 1218. Mounted below the fan-in interposer 1202 is an external device 1228 such as a wafer level chip scale package (WLCSP), a redistributed line (RDL) die, or an area array package.

The external device 1228 is connected to the fan-in interposer 1202 with interconnects such as solder balls 1230. An encapsulation 1232 fully encapsulates the wire-in-film adhesive 1206, the bond wires 1218, and the wire-bonded die 1212.

The encapsulation 1232 also encapsulates the fan-in interposer 1202 near the bond wires 1218. The fan-in interposer 1202 is exposed from the encapsulation 1232 allowing the external device 1228 to be mounted. The die pad 1220 is also exposed from the encapsulation 1232.

Figure 13:
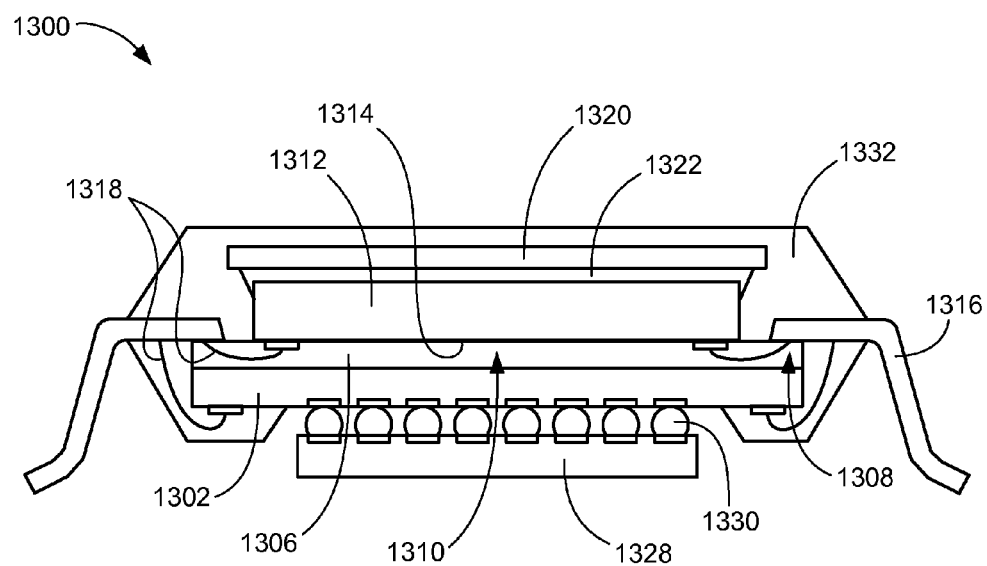
FIG. 13 is a cross-sectional view of an integrated circuit package on package system in a fourth embodiment of the present invention.

Referring now to FIG. 13, therein is shown a cross-sectional view of an integrated circuit package on package system 1300 in a fourth embodiment of the present invention. The integrated circuit package on package system 1300 is shown inverted having a fan-in interposer 1302.

The fan-in interposer 1302 may be a laminated plastic or ceramic fan-in interposer. Mounted above the fan-in interposer 1302 is a wire-in-film adhesive 1306 with edges 1308 and a center 1310. Mounted above and near the center 1310 of the wire-in-film adhesive 1306 is a wire-bonded die 1312 with an active side 1314.

The active side 1314 of the wire-bonded die 1312 is attached to the wire-in-film adhesive 1306. Further, mounted above and near the edges 1308 of the wire-in-film adhesive are leads 1316. The leads 1316 are bent toward the fan-in interposer 1302.

The leads 1316 are first bent toward the fan-in interposer 1302 and then bent out away from the edges 1308 of the wire-in-film adhesive 1306. The active side 1314 of the wire-bonded die 1312 is connected to the leads 1316 with bond wires 1318.

The wire-in-film adhesive 1306 has a low viscosity and, as temperature increases, the viscosity gets lower. Therefore, the wire-in-film adhesive 1306 can be easily pressed over the bond wires 1318 and above and around the wire-bonded die 1312 and then cured to harden the wire-in-film adhesive 1306.

It has been discovered that the wire-in-film adhesive 1306 should be a thermally conductive dielectric material. The wire-in-film adhesive 1306 can be made of a B-stage material that can be hardened after curing and can maintain a predetermined thickness. Below the wire-bonded die 1312 is a die pad 1320. The die pad 1320 is attached to the wire-bonded die 1312 with a die attach adhesive 1322.

From below, the fan-in interposer 1302 is connected to the leads 1316 with the bond wires 1318. Mounted below the fan-in interposer 1302 is an external device 1328 such as a wafer level chip scale package (WLCSP), a redistributed line (RDL) die, or an area array package.

The external device 1328 is connected to the fan-in interposer 1302 with interconnects such as solder balls 1330. An encapsulation 1332 fully encapsulates the wire-in-film adhesive 1306, the bond wires 1318, the wire-bonded die 1312, and the die pad 1320.

The encapsulation 1332 also encapsulates the fan-in interposer 1302 near the bond wires 1318. The fan-in interposer 1302 is exposed from the encapsulation 1332 allowing the external device 1328 to be mounted.

Figure 14:
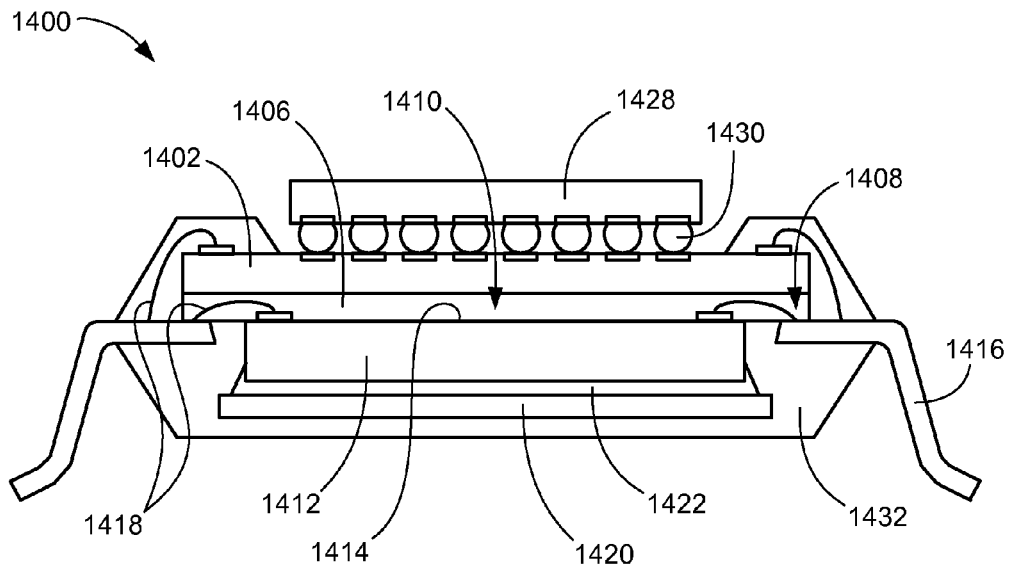
FIG. 14 is a cross-sectional view of an integrated circuit package on package system in a fifth embodiment of the present invention.

Referring now to FIG. 14, therein is shown a cross-sectional view of an integrated circuit package on package system 1400 in a fifth embodiment of the present invention. The integrated circuit package on package system 1400 is shown having a fan-in interposer 1402.

The fan-in interposer 1402 may be a laminated plastic or ceramic fan-in interposer. Mounted bellow the fan-in interposer 1402 is a wire-in-film adhesive 1406 with edges 1408 and a center 1410. Mounted bellow and near the center 1410 of the wire-in-film adhesive 1406 is a wire-bonded die 1412 with an active side 1414.

The active side 1414 of the wire-bonded die 1412 is attached to the wire-in-film adhesive 1406. Further, mounted bellow and near the edges 1408 of the wire-in-film adhesive are leads 1416. The leads 1416 are bent away from the fan-in interposer 1402.

The leads 1416 are first bent away from the fan-in interposer 1402 and then bent out away from the edges 1408 of the wire-in-film adhesive 1406. The active side 1414 of the wire-bonded die 1412 is connected to the leads 1416 with bond wires 1418.

The wire-in-film adhesive 1406 has a low viscosity and, as temperature increases, the viscosity gets lower. Therefore, the wire-in-film adhesive 1406 can be easily pressed over the bond wires 1418 and above and around the wire-bonded die 1412 and then cured to harden the wire-in-film adhesive 1406.

It has been discovered that the wire-in-film adhesive 1406 should be a thermally conductive dielectric material. The wire-in-film adhesive 1406 can be made of a B-stage material that can be hardened after curing and can maintain a predetermined thickness. Below the wire-bonded die 1412 is a die pad 1420. The die pad 1420 is attached to the wire-bonded die 1412 with a die attach adhesive 1422.

From above, the fan-in interposer 1402 is connected to the leads 1416 with the bond wires 1418. Mounted above the fan-in interposer 1402 is an external device 1428 such as a wafer level chip scale package (WLCSP), a redistributed line (RDL) die, or an area array package.

The external device 1428 is connected to the fan-in interposer 1402 with interconnects such as solder balls 1430. An encapsulation 1432 fully encapsulates the wire-in-film adhesive 1406, the bond wires 1418, the wire-bonded die 1412, and the die pad 1420.

The encapsulation 1432 also encapsulates the fan-in interposer 1402 near the bond wires 1418. The fan-in interposer 1402 is exposed from the encapsulation 1432 allowing the external device 1428 to be mounted.

Figure 15:
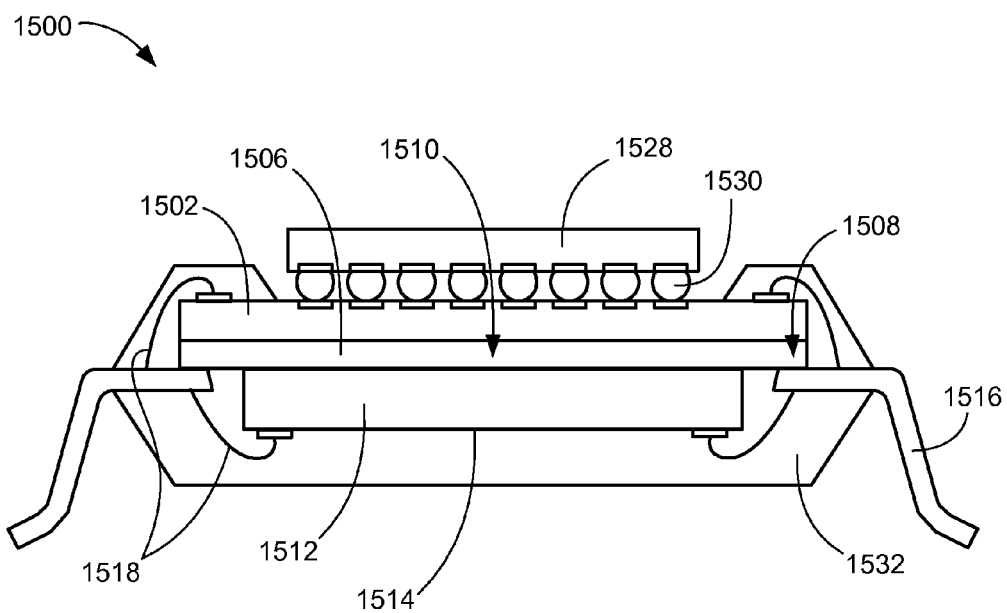
FIG. 15 is a cross-sectional view of an integrated circuit package on package system in a sixth embodiment of the present invention.

Referring now to FIG. 15, therein is shown a cross-sectional view of an integrated circuit package on package system 1500 in a sixth embodiment of the present invention. The integrated circuit package on package system 1500 is shown having a fan-in interposer 1502.

The fan-in interposer 1502 may be a laminated plastic or ceramic fan-in interposer. Mounted bellow the fan-in interposer 1502 is a wire-in-film adhesive 1506 with edges 1508 and a center 1510. Mounted bellow and near the center 1510 of the wire-in-film adhesive 1506 is a wire-bonded die 1512 with an active side 1514.

The active side 1514 of the wire-bonded die 1512 faces away from the wire-in-film adhesive 1506. Further, mounted bellow and near the edges 1508 of the wire-in-film adhesive are leads 1516. The leads 1516 are bent away from the fan-in interposer 1502.

The leads 1516 are first bent away from the fan-in interposer 1502 and then bent out away from the edges 1508 of the wire-in-film adhesive 1506. The active side 1514 of the wire-bonded die 1512 is connected to the leads 1516 with bond wires 1518.

The wire-in-film adhesive 1506 has a low viscosity and, as temperature increases, the viscosity gets lower. Therefore, the wire-in-film adhesive 1506 can be easily pressed over the bond wires 1518 and above and around the wire-bonded die 1512 and then cured to harden the wire-in-film adhesive 1506.

It has been discovered that the wire-in-film adhesive 1506 should be a thermally conductive dielectric material. The wire-in-film adhesive 1506 can be made of a B-stage material that can be hardened after curing and can maintain a predetermined thickness.

From above, the fan-in interposer 1502 is connected to the leads 1516 with the bond wires 1518. Mounted above the fan-in interposer 1502 is an external device 1528 such as a wafer level chip scale package (WLCSP), a redistributed line (RDL) die, or an area array package.

The external device 1528 is connected to the fan-in interposer 1502 with interconnects such as solder balls 1530. An encapsulation 1532 fully encapsulates the wire-in-film adhesive 1506, the bond wires 1518, and the wire-bonded die 1512.

The encapsulation 1532 also encapsulates the fan-in interposer 1502 near the bond wires 1518. The fan-in interposer 1502 is exposed from the encapsulation 1532 allowing the external device 1528 to be mounted.

Figure 16:
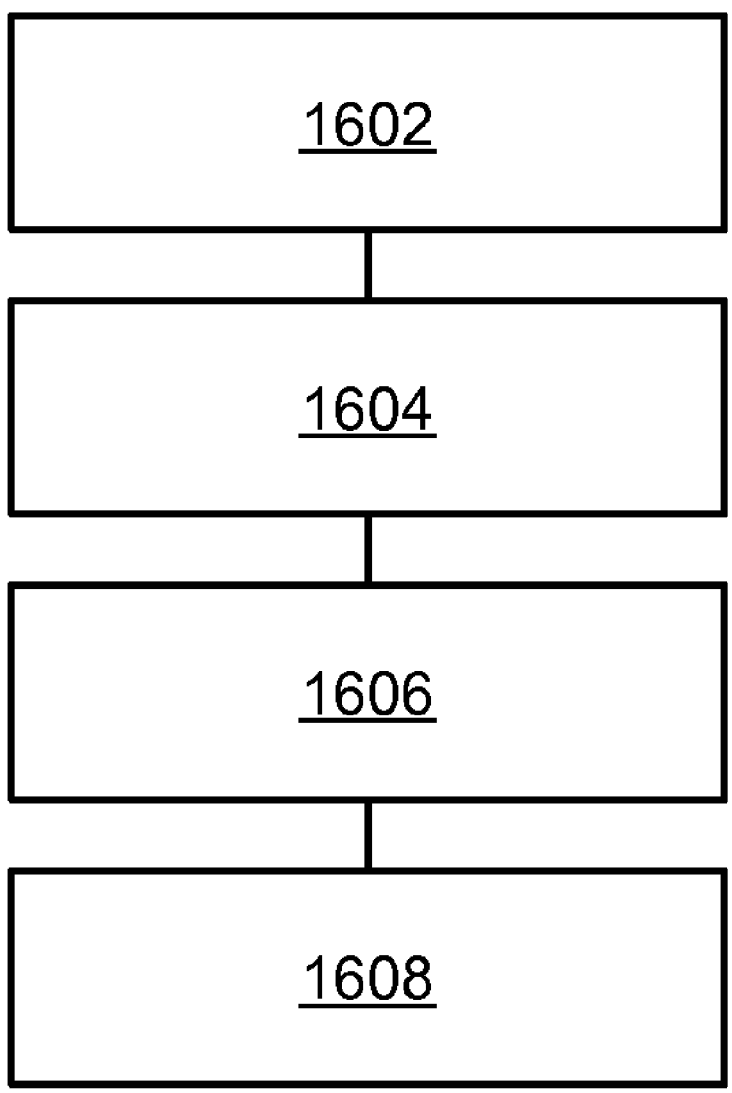
FIG. 16 is a flow chart of a system for manufacturing the integrated circuit package on package system of FIG. 1 in an embodiment of the present invention.

Referring now to FIG. 16, therein is shown a flow chart of a system 1600 for manufacturing the integrated circuit package on package system 100 of FIG. 1 in an embodiment of the present invention. The system 1600 includes providing a lead having a wire-bonded die with a bond wire connected thereto in a block 1602; mounting a fan-in interposer over the wire-bonded die and the bond wire in a block 1604; connecting the fan-in interposer to the lead with the bond wires in a block 1606; and encapsulating the wire-bonded die, bond wires, and the fan-in interposer with an encapsulation leaving a portion of the fan-in interposer exposed in a block 1608.

Thus, it has been discovered that the fan in fan-in interposer on lead system of the present invention furnishes important and heretofore unknown and unavailable solutions, capabilities, and functional aspects for package on package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package on package system comprising:
   providing a lead;
   connecting a wire-bonded die to the lead with a first bond wire therebetween;
   mounting a fan-in interposer over the wire-bonded die and the first bond wire with an adhesive in direct contact with the fan-in interposer and the lead;
   connecting the fan-in interposer to the lead with a second bond wire; and
   forming an encapsulation encapsulating the wire-bonded die, the first bond wire, the second bond wire, and the fan-in interposer leaving a portion of the fan-in interposer exposed.

2. The method as claimed in claim 1 further comprising:
   mounting a die pad below the wire-bonded die and attached thereto with a die attach adhesive;
   attaching a second wire-bonded die below the die pad with the die attach adhesive; and
   connecting the second wire-bonded die to the lead with a third bond wire.

3. The method as claimed in claim 1 further comprising:
   mounting a die pad below the wire-bonded die and attached thereto with a die attach adhesive; and
   encapsulating the die pad partially with the encapsulation.

4. The method as claimed in claim 1 further comprising:
   mounting a die pad below the wire-bonded die and attached thereto with a die attach adhesive; and
   encapsulating the die pad fully by the encapsulation.

5. The method as claimed in claim 1 further comprising:
   mounting a die pad below the wire-bonded die; and
   encapsulating the die pad partially with the die pad extending below encapsulation.

6. A method of manufacture of an integrated circuit package on package system comprising:
   providing a lead;
   connecting a wire-bonded die to the lead with a first bond wire therebetween;
   attaching a fan-in interposer to the wire-bonded die and the lead with an adhesive in direct contact with the fan-in interposer and the lead;
   connecting the fan-in interposer to the lead with a second bond wire;
   forming an encapsulation encapsulating the wire-bonded die, the first bond wire, the second bond wire, and the fan-in interposer leaving a portion of the fan-in interposer exposed;
   bending the lead extending from an outer edge of the encapsulation; and
   mounting an external device above the fan-in interposer.

7. The method as claimed in claim 6 wherein:
   bending the lead includes bending the lead away from the fan-in interposer and away from the encapsulation.

8. The method as claimed in claim 6 wherein:
   bending the lead includes bending the lead toward the fan-in interposer and away from the encapsulation.

9. The method as claimed in claim 6 wherein:
   attaching the fan-in interposer to the wire-bonded die includes mounting the wire-bonded die with the active side facing away from the wire-in-film adhesive.

10. The method as claimed in claim 6 wherein:
mounting the external device above the fan-in interposer includes connecting the external device to the fan-in interposer with solder balls.

11. An integrated circuit package on package system comprising:
a lead;
a wire-bonded die connected to the lead;
a first bond wire connected between the wire-bonded die and the lead;
a fan-in interposer mounted over the wire-bonded die and the first bond wire;
an adhesive in direct contact with the fan-in interposer and the lead;
a second bond wire connecting the fan-in interposer to the lead; and
an encapsulation encapsulating the wire-bonded die, the first bond wire, and the fan-in interposer leaving a portion of the fan-in interposer exposed.

12. The system as claimed in claim 11 further comprising:
a die pad mounted below the wire-bonded die and attached thereto;
a die attach adhesive attaching the die pad and the wire-bonded die;
a second wire-bonded die attached below the die pad with the die attach adhesive; and
a third bond wire connecting the second wire-bonded die to the lead.

13. The system as claimed in claim 11 further comprising:
a die pad mounted below the wire-bonded die and attached thereto;
a die attach adhesive connecting the die pad and the wire-bonded die; and
wherein:
the die pad is partially encapsulated with the encapsulation.

14. The system as claimed in claim 11 further comprising:
a die pad mounted below the wire-bonded die and attached thereto;
a die attach adhesive attaching the die pad and the wire-bonded die; and
wherein:
the die pad is fully encapsulated by the encapsulation.

15. The system as claimed in claim 11 further comprising:
a die pad mounted below the wire-bonded die and extending below the encapsulation.

16. The system as claimed in claim 11 further comprising:
an external device mounted above the fan-in interposer; and
wherein:
the leads are bent and extend from an outer edge of the encapsulation.

17. The system as claimed in claim 16 wherein:
the leads are bent away from the fan-in interposer and bent away from the encapsulation.

18. The system as claimed in claim 16 wherein:
the leads are bent toward the fan-in interposer and bent away from the encapsulation.

19. The system as claimed in claim 16 wherein:
the wire-bonded die has the active side facing away from the wire-in-film adhesive.

20. The system as claimed in claim 16 further comprising:
a solder ball connects the external device to the fan-in interposer.

* * * * *